United States Patent [19]
Shim et al.

[11] Patent Number: 5,959,318
[45] Date of Patent: *Sep. 28, 1999

[54] SOLID STATE IMAGE PICKUP DEVICE WITH POLYGATES

[75] Inventors: Jin Seop Shim; Chul Ho Park, both of Chungcheongbuk-do, Rep. of Korea

[73] Assignee: LG Semicon Co., Ltd., Chungcheongbuk-Do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/856,030

[22] Filed: May 14, 1997

[30] Foreign Application Priority Data

Dec. 28, 1996 [KR] Rep. of Korea ............ 96-75481

[51] Int. Cl.$^6$ ............ H01L 27/148; H01L 29/768
[52] U.S. Cl. ............ 257/231; 257/232; 257/233; 257/292; 257/294; 257/240; 257/249; 257/250
[58] Field of Search ............ 257/233, 232, 257/292, 294, 432, 231, 249, 250, 240

[56] References Cited

U.S. PATENT DOCUMENTS

| | | | |
|---|---|---|---|
| 3,982,315 | 9/1976 | Kubo | 29/572 |
| 4,178,396 | 12/1979 | Okano et al. | 257/233 X |
| 5,250,825 | 10/1993 | Negishi et al. | 257/250 X |
| 5,514,887 | 5/1996 | Hokari | 257/222 |
| 5,614,741 | 3/1997 | Harada et al. | 257/250 X |
| 5,693,967 | 12/1997 | Park et al. | 257/223 |

FOREIGN PATENT DOCUMENTS

| | | | |
|---|---|---|---|
| 359196667 | 11/1984 | Japan | 257/233 |
| 403171769 | 7/1991 | Japan | 257/249 |
| 404076952 | 3/1992 | Japan | 257/233 |

OTHER PUBLICATIONS

Aoki et al, "A 1,024 Element Linear CCD Sensor With PN Junction Photodiode", *The Transactions of The IECE of Japan*, vol. I 62, No. 6, Jun. 1979, pp. 434–435.

*Primary Examiner*—William Mintel
*Attorney, Agent, or Firm*—Morgan, Lewis & Bockius LLP

[57] ABSTRACT

A solid state image pickup device includes a semiconductor substrate, a CCD channel region in the semiconductor substrate, a plurality of polygates over the CCD channel regions, and a photoelectric conversion region having a portion above an uppermost surface of the semiconductor substrate.

18 Claims, 5 Drawing Sheets

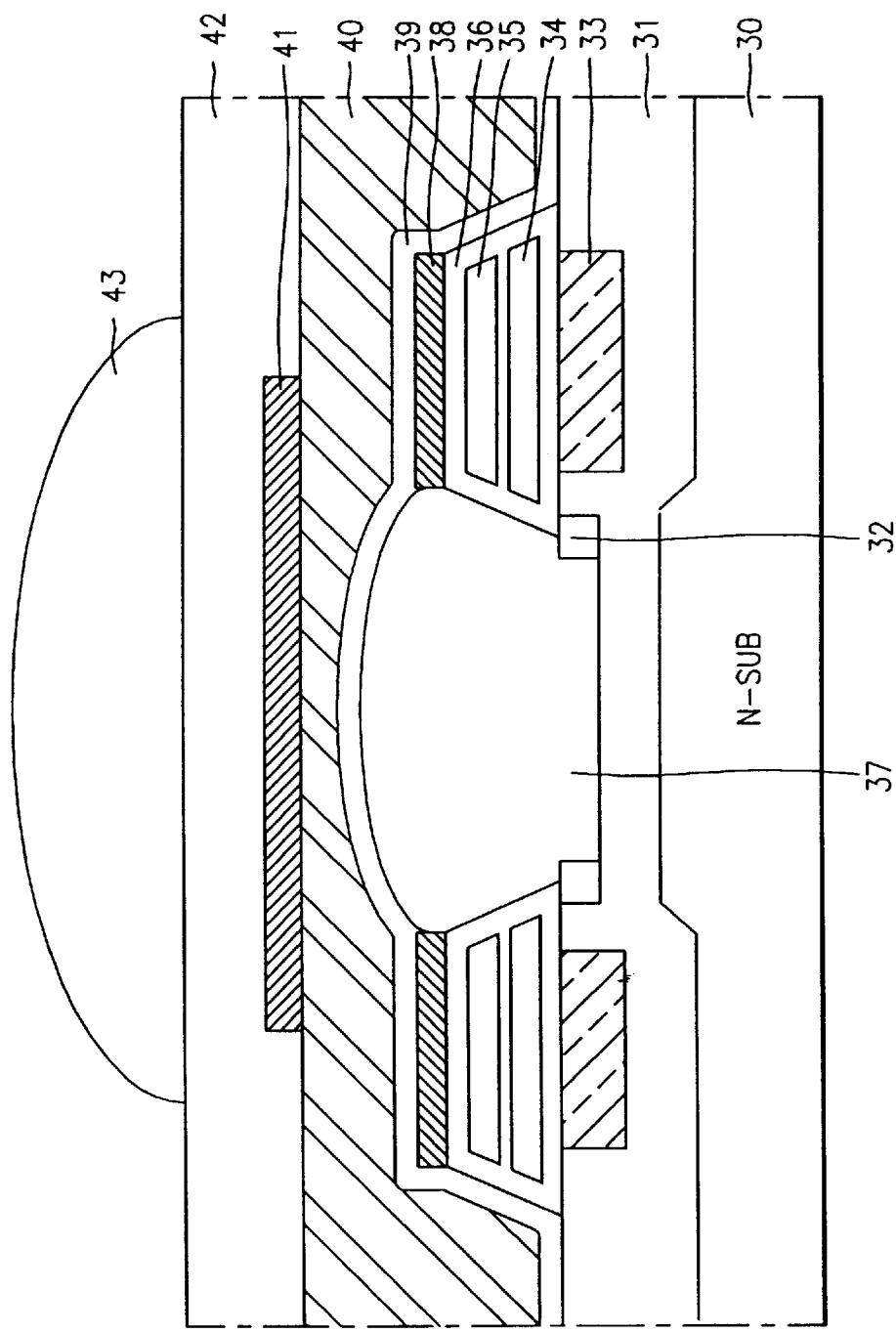

FIG. 4A
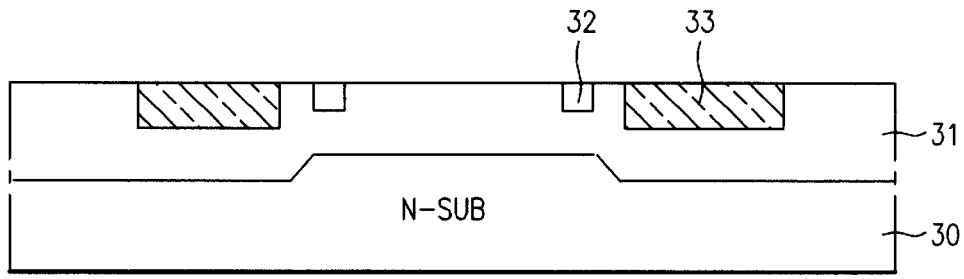
FIG. 4B
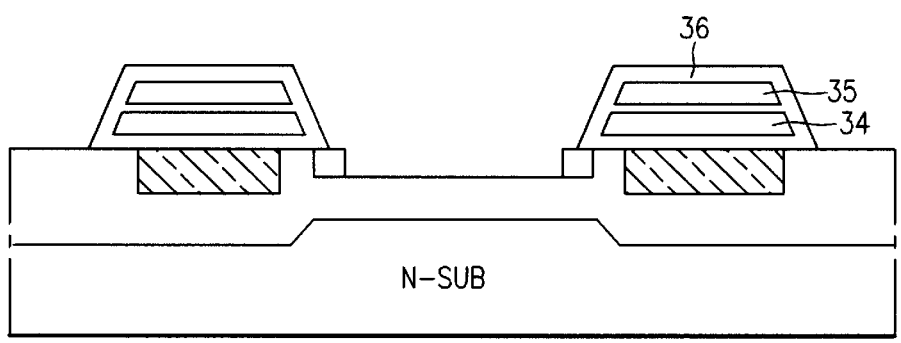
FIG. 4C
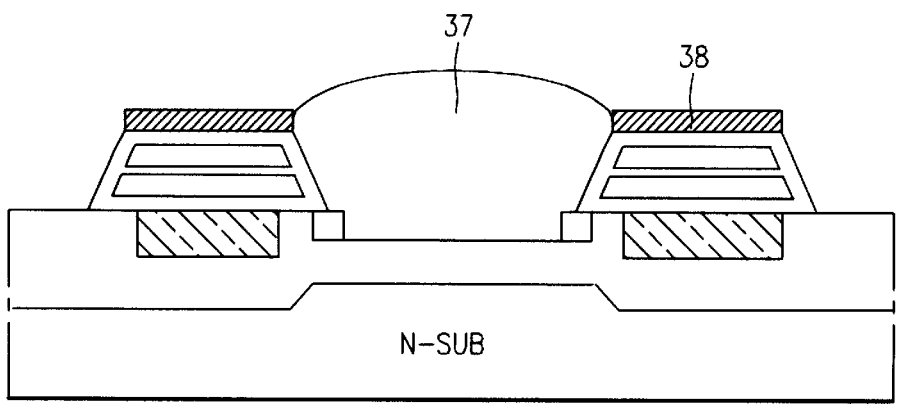

F I G.4D
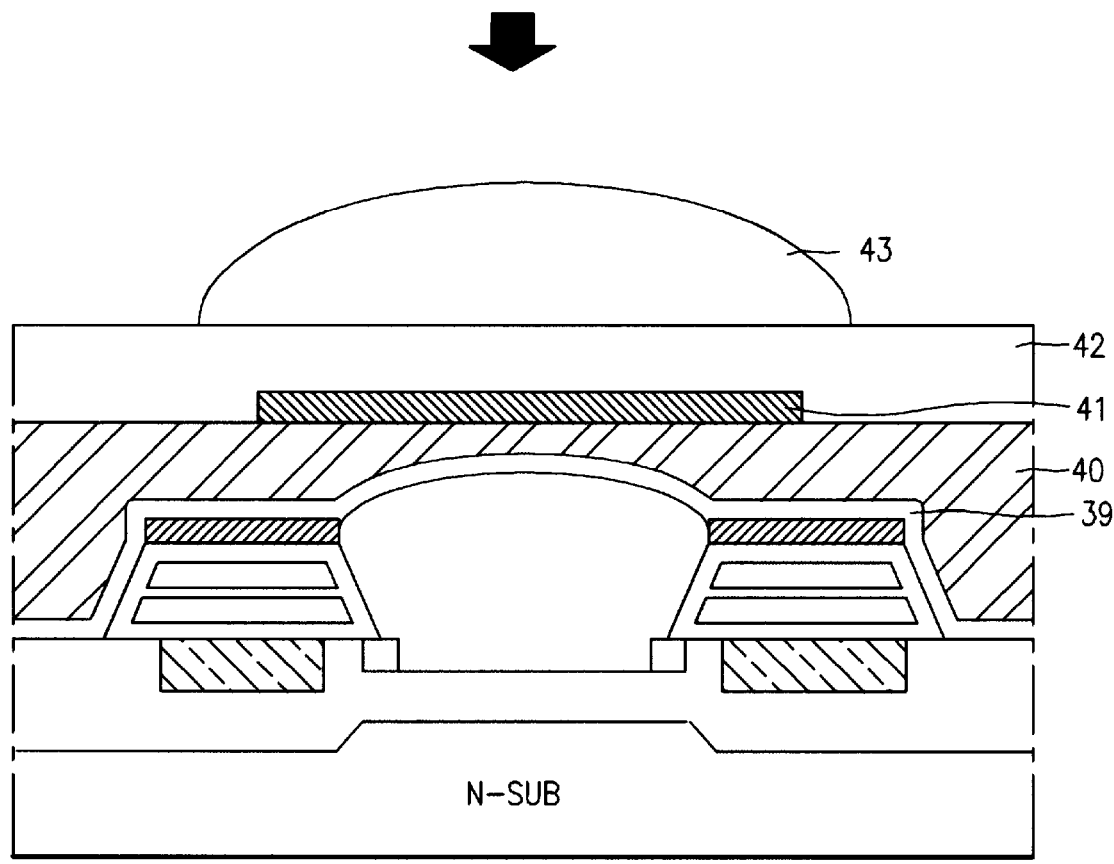

SOLID STATE IMAGE PICKUP DEVICE WITH POLYGATES

This application claims the benefit of Korean Application No. 75481/1996 filed Dec. 28, 1996, which is hereby incorporated by reference.

BACKGROUND OF THE INVENTION

1. Field of the Invention

The present invention relates to a semiconductor device, and more particularly, to a solid state image pickup device and a method of fabricating the same. Although the present invention is suitable for a wide scope of applications, it is particularly suitable for a solid state image pickup device and a method of fabricating the same for improving sensitivity of the semiconductor device.

2. Discussion of the Related Art

A conventional solid state image pickup device includes a plurality of photoelectric conversion regions having photodiodes (PD), a vertical charge coupled device (VCCD) region between the plurality of photoelectric conversion regions and transferring the charge generated in the photoelectric conversion regions in a vertical direction, a horizontal charge coupled device (HCCD) region transferring in a horizontal direction the charge transferred from the VCCD region in the vertical direction, and a floating diffusion region sensing and amplifying the charge transferred in the horizontal direction and outputting it to a periphery circuit.

A conventional solid state image pickup device and a manufacturing method thereof will be explained with reference to the accompanying drawings.

FIG. 1 is a cross-sectional view showing the structure of a conventional solid state image pickup device and FIGS. 2A to 2C are cross-sectional views showing the process steps of fabricating the conventional solid state image pickup device.

As shown in FIG. 1, a conventional solid state image pickup device includes a plurality of photoelectric conversion regions 8 converting ah image signal of incident light into an electrical signal and formed in a p-well region 2 of an n-type substrate 1, charge coupled device (CCD) channel regions 4 formed between the photoelectric conversion regions and transferring the image charge generated in the photoelectric conversion regions 8 in a vertical direction, a channel stop layer 3 around each of the plurality of photoelectric conversion regions 8, a plurality of first and second polygates 6 and 7 insulated from each other by an insulating layer 5 over the CDD channel regions 4 and overlapping with each other in a predetermined area, a metal shading layer 9 formed on the insulating layer 7 exclusive of a portion over the photoelectric conversion region 8, an interlayer insulating layer 10 formed on the entire surface including the metal shading layer 9, a planarizing insulating layer 11 formed on the interlayer insulating layer 10, a color filter layer 12 formed on the planarizing insulating layer 11 over the photoelectric conversion layer 9, a top coating layer 13 on the entire surface including the color filter layer 12, and a microlens 14 formed on the top coating layer 13 focusing light image signal onto the photoelectric conversion region 8.

A method of fabricating a solid state image pickup device will be explained with reference to the accompanying drawings.

Referring to FIG. 2A, a p-well 2 is formed on an n-type substrate 1. Next, pixels and a channel stop layer 3 isolating the pixels from one another are formed in the p-well 2.

Subsequently, an ion implantation process for a buried charge coupled device (BCCD) is carried out to form CCD channel regions of VCCD and HCCD regions.

Referring to FIG. 2B, a gate insulating layer is formed on a polysilicon layer deposited on the entire surface including the CCD channel regions 4. Subsequently, the polysilicon layer is patterned to be left over predetermined portions of the CCD channel regions 4 to form first polygates 5. Then, another insulating layer for insulating electrodes from one another is formed on the entire surface including the first polygates 5. Thereafter, a polysilicon layer is deposited and then patterned to be left over the first polygates 5 to form second polygates 6.

Subsequently, an insulating layer is formed on the entire surface including the second polygates 6. Next, an n-type ion implantation process is carried out to form a photodiode region and then a p-type ion implantation process is carried out to complete a photoelectric conversion region 8. A metal shading layer 9 is formed on the insulating layer exclusive of a portion over the photoelectric conversion region 8, so that the light is transmitted only to the photoelectric conversion region 8. Thereafter, an interlayer insulating layer 10 is formed on the entire surface including the metal shading layer 9 to protect the surface of the metal shading layer 9.

Referring to FIG. 2C, a planarizing insulating layer 11 is formed on the interlayer insulating layer 10. A color filter layer 12 filtering specific wavelengths from the light is formed on the planarizing insulating layer 11 over the photoelectric conversion region 9. Next, a top coating layer 13 is formed on the planarizing insulating layer 11 including the color filter layer 12 and then a microlens 14 is formed on the top coating layer 13. Then, a pad-opening process is carried out for a wirebonding process (not shown).

In the a conventional solid state image pickup device, the light transmitted through a camera lens is focused by the microlens 14 and only specific wavelengths from the light is irradiated to the photoelectric conversion region 8. The irradiated light to the photoelectric conversion region 8 is converted into the image charge to be transferred through the CCD channel regions 4 to a floating diffusion region (not shown). The transferred image charge is sensed and amplified in the floating diffusion region and then is transferred to a peripheral circuit.

However, a conventional solid state image pickup device and a method of fabricating the same have the following problems.

First, a light-receiving area is not wide enough in a photoelectric conversion region because the CCD channel regions and the photoelectric conversion region have a same planar structure. The amount of received light thus is not enough to obtain a good image sensitivity.

Second, since the photoelectric conversion region is located far from the microlens, the amount of light transmitted into the photoelectric conversion region is limited when the light is irradiated in a tilted direction. Moreover, since the light is not completely refracted against the microlens, the nonirradiated light into the photoelectric conversion region is scattered. Thus, to the conventional solid state image pickup device has a poor image sensitivity due to a smearing effect in the photoelectric conversion region.

SUMMARY OF THE INVENTION

Accordingly, the present invention is directed to a solid state image pickup device and a method of fabricating the same that substantially obviate one or more of problems due to limitations and disadvantages of the related art.

An object of the invention is to provide a solid state image pickup device in which a light-receiving area is increased to improve a sensitivity of a semiconductor device and a method of fabricating the same.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the solid state image pickup device includes a plurality of photoelectric conversion regions formed under and on a surface of a semiconductor substrate, CCD channel regions each formed between the photoelectric conversion regions and transferring image charge generated in the photoelectric conversion regions in a direction, and first and second polygates insulated by insulating layers on the CCD channel regions and repeatedly formed opposite to each of the photoelectric conversion regions.

In another aspect of the present invention, a solid state image pickup device includes a semiconductor substrate, a CCD channel region in the semiconductor substrate, a plurality of polygates over the CCD channel regions, and a photoelectric conversion region having a portion above an uppermost surface of the semiconductor substrate.

In another aspect of the present invention, a solid state image pickup device includes a semiconductor substrate, a p-well region in the semiconductor substrate, a CCD channel region in the p-well region, a plurality of polygates over the CCD channel region, a photoelectric conversion region having a portion above an uppermost surface of the semiconductor substrate and between the polygates, a channel stop layer at lower edges of the photoelectric conversion region, a metal shading layer over the polygates, a passivation layer on an exposed surface, a planarizing insulating layer on the passivation layer, a color filter on the planarizing insulating layer, a top coating layer on the color filter including the planarizing insulating layer, and a microlens on the top coating layer.

In another aspect of the present invention, a method of fabricating a solid state image pickup device having a semiconductor substrate, the method includes the steps of forming a CCD channel region in the semiconductor substrate, forming a plurality of polygates over the CCD channel region, and forming a photoelectric conversion region having a portion above an uppermost surface of the semiconductor substrate.

In a further aspect of the present invention, a method of fabricating a solid state image pickup device having a semiconductor substrate, the method includes the steps of forming a p-well region in the semiconductor substrate, forming a channel step region in the p-well region, forming a CCD channel region in the p-well region, forming a plurality of polygates over the CCD channel region, forming a photoelectric conversion region having a portion above an uppermost surface of the semiconductor substrate and between the polygates, forming a metal shade layer over the polygates, forming a passivation layer on an expose surface over the semiconductor substrate, forming a planarizing insulating layer on the passivation layer, forming a color filter on the planarizing insulating layer, forming a top coating layer on the color filter, and forming a microlens on the color filter including the planarizing layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a cross-sectional view showing a structure of a solid state image pickup device in accordance with a preferred embodiment of the present invention; and FIGS. 4A to 4D are cross-sectional views showing the process steps of fabricating a solid state image pickup device in accordance with a preferred embodiment of the present invention.

DETAILED DESCRIPTION OF THE PREFERRED EMBODIMENTS

Figure 1:
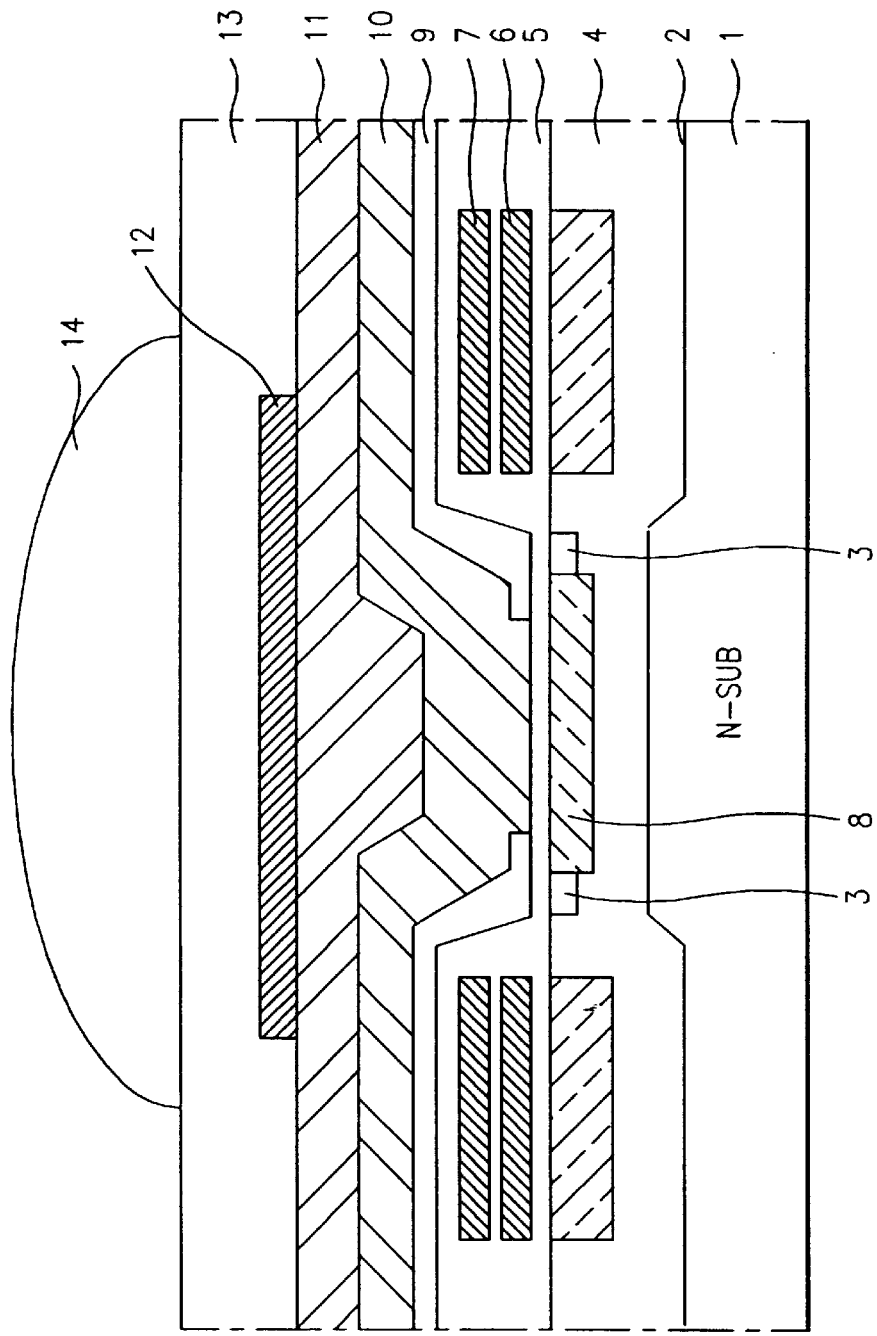
FIG. 1 is a cross-sectional view showing a structure of a conventional solid state image pickup device.
Figure 2A:
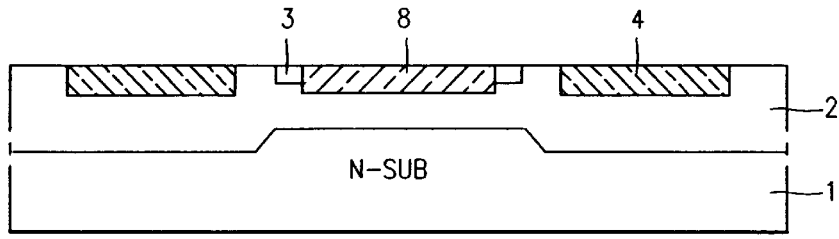
FIGS. 2A to 2C are cross-sectional views showing the process steps of fabricating a conventional solid state image pickup device.
Figure 2B:
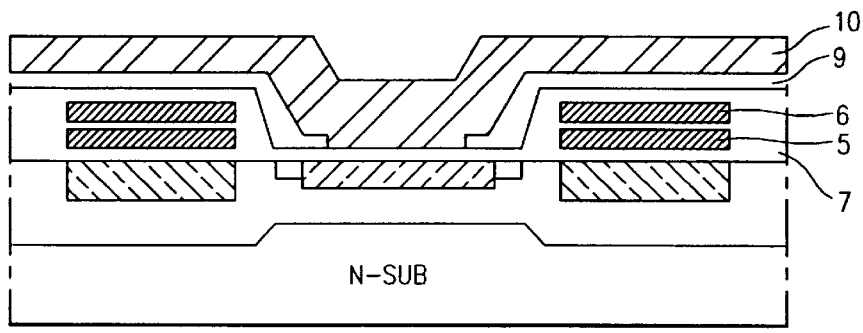
Figure 2C:
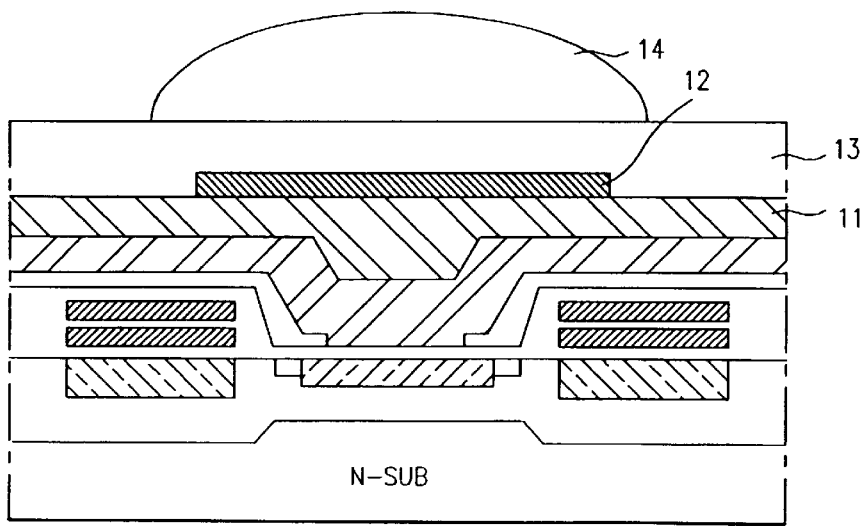

Reference will now be made in detail to the preferred embodiments of the present invention, examples of which are illustrated in the accompanying drawings.

Referring to FIG. 3, a solid state image pickup device having a different structure of a light-receiving region from the conventional device includes a plurality of photoelectric conversion regions 37 having a portion above an uppermost surface of an n-type semiconductor substrate 30 and a p-well region 31 formed into the substrate 30, the photoelectric conversion region having a convex top surface formed by an epitaxial growth process to deposit an n-type silicon layer on the semiconductor substrate 30, the photoelectric conversion regions converting an image signal of incident light into an electrical signal, CCD channel regions 33 formed in the p-well region 31 between the photoelectric conversion regions 37 and transferring in a vertical direction an image charge generated in the photoelectric conversion regions 37, a channel stop layer 32 formed in the p-well region 31 around the photoelectric conversion region 37, a plurality of first, and second polygates 34 and 35 separated by an insulating layer 36 on the CCD channel regions 33 and repeatedly formed to be overlapped with each other in a predetermined area, a metal shading layer 38 formed on the insulating layer 36 exclusive of the photoelectric conversion region 37, a passivation layer 39 formed on the entire surface including the metal shading layer 38, a planarizing insulating layer 40 formed on the passivation layer 39, a color filter layer 41 formed on the planarizing insulating layer 40 over the photoelectric conversion region 37, and a microlens 43 formed on the entire surface including the color filter layer 41 and focusing on a top coating layer 42 a light image signal in the photoelectric conversion reign 37. The top surface of photoelectric conversion region 37 is closer to the color filter layer 41 than those of the first and second polygates 34 and 35. A refractive index of the epitaxial layer of the photoelectric conversion region 37 is lower than that of the planarizing insulating layer 40.

A method of fabricating a solid state image pickup device having the aforementioned structure will be explained with reference to the accompanying drawings.

Referring initially to FIG. 4A, a p-well 31 is formed in an n-type substrate 30. Next, a channel stop layer 32 insulating pixels from one another is formed in the p-well 31 using ion implantation. Subsequently, an ion implantation process for a buried charge coupled device (BCCD) is performed to form CCD channel regions 33 of HCCD and VCCD regions.

Referring to FIG. 4B, a gate insulting layer is formed on the entire surface over the CCD channel regions 33. Then, a polysilicon layer is deposited on the gate insulating layer, and then is patterned to form first polygates 34 on the CCD channel regions 33.

Thereafter, another insulating layer is formed on the entire surface including the first polygates 34. Next, another polysilicon layer is deposited thereon and then is patterned to be overlapped with the first polygates 34 in a predetermined area to form second polygates 35. Subsequently, another insulating layer is formed on the entire surface including the second polygates 35 and then selectively removed, so that the insulating layer is left at the first and second polygates 34 and 35 over the CCD channel regions 33.

Referring to FIG. 4C, n-type ions are implanted and diffused to an epitaxially grown silicon layer for a photoelectric conversion region to form a photodiode n-well (PDN) region to complete a photoelectric conversion region 37. In this process, the epitaxial layer has a convex surface and its thickness is greater than the first and second polygates 34 and 35.

Next, an insulating layer is formed on the entire surface including the photoelectric conversion region 37. Then a metal shading layer 38 is formed on the insulating layer 36 over the first and second polygates 34 and 35.

Referring to FIG. 4D, a passivation layer 39 is formed on the entire surface including the metal shading layer 38 and the photoelectric conversion region 37 and then a planarizing insulating layer 40 is formed thereon. Next, a color filter layer 41 is formed on the planarizing insulating layer 40 over the photoelectric conversion region 37 to filter the specific wavelengths from the light through the planarizing insulating layer 40.

Subsequently, a top coating layer 42 is formed on the planarizing insulating layer 40 including the color filter layer 41, and then a microlens 43 is formed on the top coating layer over the color filter layer 41 and the photoelectric conversion region 37. Thereafter, a pad open process is carried out for a wire-bonding process (not shown).

Since the photoelectric conversion region 37 is formed by epitaxial growth of a silicon layer on the substrate 30, the surface defect is relatively reduced, and thus a $p^+$-type ion implantation process is not necessary in the present invention.

By adjusting the condition of the epitaxial growth, the amount of impurity ions of the PDN region is higher than that of the epitaxial layer. As a result, the refractive index of the epitaxial layer is lower than that of the planarizing insulating layer 40.

In the solid state image pickup device of the aforementioned structure, the light transmitted through a camera lens is focused on a microlens 43 and the specific wavelengths from the light are irradiated to the photoelectric conversion region 37. The light irradiated to the photoelectric conversion region 37 is converted into an image charge and transmitted through a CCD region 33 such as a VCCD region. The transmitted image charge is then sensed and amplified in a floating diffusion region (not shown) and is transmitted into a peripheral circuit.

A solid state image pickup device of the present invention has the following advantages.

First, since a photoelectric conversion region is wide and deep, light-receiving power and photoelectric conversion are improved so that an image sensitivity is much improved.

Second, the overall process is simplified by using epitaxial growth to form the photoelectric conversion region.

Third, since the area of the photoelectric conversion region is higher than that of the CDD channel region, the planarizing process is readily facilitated. In addition, since the area of the photoelectric conversion region is large, the efficiency of focusing light is consistent even though the radius of curvature of the microlens becomes large. Accordingly, the resulting increased process tolerance is helpful for the manufacturing process.

Fourth, the photoelectric conversion region having a convex surface collects the incident light perpendicular to the surface from any directions. Thus, smearing is decreased so that picture quality is much improved.

It will be apparent to those skilled in the art that various modifications and variations can be made in the solid state image pickup device and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A solid state image pickup device comprising:
   a semiconductor substrate;
   a CCD channel region in the semiconductor substrate;
   first and second polygates over the CCD channel region, the first polygate having a lateral width as viewed in cross-section different from the second polygate;
   a photoelectric conversion region having a portion above an uppermost surface of the semiconductor substrated; and
   a metal shading layer over the first and second polygates, the metal shading layer directly contacting an upper portion of the photoelectric conversion region.

2. The device according to claim 1, wherein the photoelectric conversion region has a thickness larger than the polygates.

3. The device according to claim 1, wherein the photoelectric conversion region has a convex top surface.

4. The device according to claim 1, wherein the polygates are separated by an insulating layer.

5. The device according to claim 1, further comprising a channel stop layer at lower edges of the photoelectric conversion region.

6. The device according to claim 1, further comprising a p-well region in the semiconductor substrate.

7. The device according to claim 1, further comprising a color filter over the photoelectric conversion region.

8. The device according to claim 1, further comprising a microlens over the photoelectric conversion region.

9. A solid state image pickup device comprising:
   a semiconductor substrate;
   a p-well region in the semiconductor substrate;
   a CCD channel region in the p-well region;
   first and second polygates over the CCD channel region, the first polygate having a lateral width as viewed in cross-section different from the second polygate;
   a photoelectric conversion region having a portion above an uppermost surface of the semiconductor substrate and between the polygates;
   a channel stop layer at lower edges of the photoelectric conversion region;

a metal shading layer over the polygates, the metal shading layer directly contacting an upper portion of the photoelectric conversion region;

a passivation layer on an exposed surface of the semiconductor substrate;

a planarizing insulating layer on the passivation layer;

a color filter on the planarizing insulating layer;

a top coating layer on the color filter including the planarizing insulating layer; and a microlens on the top coating layer.

10. The device according to claim 9, wherein the polygates includes polysilicon.

11. The device according to claim 9, wherein the photoelectric conversion region has a refractive index lower than the planarizing insulating layer.

12. The device according to claim 9, wherein the photoelectric conversion region has a convex top surface.

13. The device according to claim 9, wherein the photoelectric conversion region has a thickness larger than the polygates.

14. The device according to claim 1, wherein at least one of the first and second polygates has a sloped sidewall.

15. The device according to claim 1, wherein the first and second polygates have bottom portions wider than top portions.

16. The device according to claim 1, wherein the first polygate has a width larger than the second polygate.

17. The device according to claim 9, wherein at least one of the first and second polygates has a sloped sidewall.

18. The device according to claim 9, wherein the first and second polygates have bottom portions wider than top portions.

* * * * *